United States Patent [19]

Heiart

[11] Patent Number: 4,548,884
[45] Date of Patent: Oct. 22, 1985

[54] REGISTERING AND EXPOSING SHEET SUBSTRATES USING PHOTOSENSITIVE LIQUID

[75] Inventor: Robert B. Heiart, Middletown, N.J.

[73] Assignee: E. I. Du Pont de Nemours and Company, Wilmington, Del.

[21] Appl. No.: 612,862

[22] Filed: May 22, 1984

Related U.S. Application Data

[63] Continuation of Ser. No. 387,535, Jun. 11, 1982, abandoned.

[51] Int. Cl.⁴ .......................... G03F 9/00; G03C 5/00
[52] U.S. Cl. ...................................... 430/22; 430/322; 430/325; 430/326; 430/327; 430/935; 430/312
[58] Field of Search ............... 430/22, 327, 322, 325, 430/326, 271, 281, 935, 312; 355/85, 86, 100, 102, 103

[56] References Cited

U.S. PATENT DOCUMENTS

| | | | |
|---|---|---|---|
| 3,535,157 | 10/1970 | Steinhoff et al. | 430/935 |
| 3,573,975 | 4/1971 | Dhaka et al. | 177/212 |
| 3,837,887 | 9/1974 | Akamatsu et al. | 177/34 |
| 4,056,423 | 11/1977 | Hughes | 156/356 |
| 4,201,581 | 5/1980 | Thomas et al. | 430/396 |
| 4,230,793 | 10/1980 | Losert et al. | 430/315 |
| 4,281,922 | 8/1981 | Matsumoto | 355/99 |
| 4,298,680 | 11/1981 | Bruno | 430/300 |
| 4,360,267 | 11/1982 | Nettesheim et al. | 355/100 |
| 4,424,089 | 1/1984 | Sullivan | 156/155 |

FOREIGN PATENT DOCUMENTS

56-64343  6/1981  Japan ................... 430/327

Primary Examiner—John E. Kittle
Assistant Examiner—José G. Dees

[57] ABSTRACT

A process is disclosed for the application of a photosensitive liquid between the substrate and the photomask during contact printing. The substrate and photomask are aligned in a hinged relationship.

25 Claims, 3 Drawing Figures

REGISTERING AND EXPOSING SHEET SUBSTRATES USING PHOTOSENSITIVE LIQUID

This is a continuation of application Ser. No. 387,535 filed June 11, 1982, now abandoned.

BACKGROUND OF THE INVENTION

There is a continuing need in the printed circuit, graphic arts, and related industries to transfer images photographically from original (positive or negative) photomasks to one or both sides of a light sensitive sheet. In many important cases, these images must be aligned or registered precisely to locations previously established on the element. In the case where images are transferred to both sides of the element, it is often further required that the front and rear images also be registered precisely to each other. In all cases, the photographic operation is carried out in a manner which maintains, to the greatest precision possible, both the definition and the relative locations of the features of the images, while minimizing the transfer of undesired or spurious features.

Printed circuits are often prepared by a repetitive image transfer process using dry film photoresists. The equipment used to practice the photoresist process has consisted in general of discrete pieces such as a cleaner or scrubber for cleaning the copper-clad substrate boards, an oven for preheating the boards, a roll laminator applying heat to the film and board as it laminates them together, an actinic radiation exposure station, and solvent wash-out apparatus for developing a resist image on the copper substrate. Such processes and equipment are fully described in Coombs, "Printed Circuits Handbook", McGraw-Hill Second Edition (1979) and in DeForest, "Photoresist Materials and Processes", McGraw-Hill (1975).

Typically, manual transfer and positioning of the substrate board occurs between each piece of equipment which increases expense and lessens reproducibility, leading to yield loss in the process.

Various attempts have been made to automate the photoresist process but automation has been adopted to only a limited extent. Recently, however, board trimming has been successfully incorporated into an integrated high productivity cleaning and laminating system as disclosed in U.S. Pat. No. 4,293,635 and European Patent Application 81104013.8, U.S. Pat. No. 153,636, abandoned, and U.S. Ser. No. 153,637, abandoned, both filed May 27, 1980. This automation results in substantial cost savings to the user. Nevertheless, many of the subsequent steps remain highly labor intensive and prone to human error. This is particularly true of the registration and exposure steps.

Contact printing is virtually the universal method of exposure used today in the printed circuit and graphic art industries despite certain known shortcomings. Although low in equipment cost, simple to use, and capable of excellent line definition, contact printing is labor intensive and slow (because of long vacuum draw-down times). It also is subject to losses due to damaged or dirty photomasks resulting from repeated use. This, in turn, requires frequent and expensive touch up and replacement of photomasks to avoid yield penalties. Much time is also lost in the constant and tedious process of inspecting photomasks for defects between exposure. In addition, variations in frame temperature and ambient humidity affect corner-to-corner registration, especially for large boards, unless expensive, fragile, glass photomasks are used.

Alternative exposure methods such as gap printing, projection printing and laser scanning each offer some significant advantages over contact printing. However, in the current state of development, all have serious limitations for high productivity applications and are intrinsically much higher in equipment cost.

SUMMARY OF THE INVENTION

The present invention is directed to a process of imagewise exposure to actinic radiation of a photosensitive layer applied to a sheet substrate with registration of a photomask to the substrate comprising the steps of:
(1) advancing a substrate to a position in a device to undertake in either order or concurrently
  (a) aligning the substrate and a photomask in a predetermined relationship to one another;
  (b) applying a photosensitive liquid between the substrate and the photomask,
(2) contacting through the photosensitive liquid the substrate and the photomask whereby during said contacting substantially no movement of the photomask occurs relative to the substrate other than a more intimate contact due to displacement of the photosensitive liquid in a liquid layer and whereby at least one of interfacial or viscous force aids in holding the substrate and photomask in a fixed position relative to one another;
(3) exposing the photosensitive liquid to actinic radiation through the photomask;
(4) removing the photomask from the substrate whereby substantially no hardened material resulting from the photosensitive liquid remains on the photomask;
(5) obtaining a substrate containing discrete portions of bonded hardened material resulting from the photosensitive liquid.

DETAILED DESCRIPTION OF THE INVENTION

The sheet substrates which are to be coated and imaged according to the teachings of the present invention are varied and depend on the utility of the final article. The substrate may be rigid or flexible, rough or smooth, homogenous or nonhomogeneous, electrically conductive or nonconductive. The substrate may be coated with photosensitive liquid and imaged on one or both sides and the substrate surface may itself be photosensitive prior to application of the photosensitive liquid.

In the process of this invention either one or a number of sheet substrates are introduced into a registration and exposure device. The registration portion of the apparatus allows registration of the substrate, generally rectangular, to a photomask in a precise alignment. The photomask allows imagewise exposure of a photosensitive layer to actinic radiation.

The photomask is a flexible sheet which allows actinic radiation to pass. Either one or two photomasks can be used since both sides of the sheet substrate may be imaged in sequence or simultaneously. With two photomasks a leading edge of each can be joined in a parallel, hinged relationship on each side of a thin carrier whose thickness approximates the thickness of the substrate. The photomasks can be maintained in precise register with each other by virtue of their hinged relationship to the common carrier.

With use of two photomasks the substrate is positioned or aligned between the photomask so the substrate is in registration with at least one photomask. Registration contact can be simple edge-to-edge contact of the substrate with a carrier wherein the only added criterion is that the desired image pattern of the photomask is completely contained within the area of the sheet to be imaged. However, registration more generally requires the precise alignment of details contained on the the substrate with details of the photomask image or images. In this instance at least two contact points on or in the sheet are brought into a fixed relationship with two corresponding contact points fixed to the carrier. Such points may be notched and tabs suitably spaced on the sheet and carrier edges. Alternatively the points may consist of registration pin and hole combinations wherein the sheet contains precision drilled registration holes which are positioned in the desired orientation by registration pins. With use of a number of substrates the registration is identical from substrate to substrate to obtain a number of substantially identically exposed photosensitive layers on the substrates for subsequent processing.

Once the substrate is in registration relationship to the carrier, the flexible film photomask is applied to at least one side of the substrate in the presence of a photosensitive liquid interlayer by applying normal pressure in a line roughly parallel to the carrier on the outer surfaces of the photomasks at or near the hinged edges and advancing (relatively) the pressure line in the direction perpendicular to the hinge line and parallel to the substrate surface and, concurrent with the advance, applying the photosensitive liquid, e.g., by coating, to the substrate and/or the inner surface of the photomask. In effect the nip between the substrate and photomask formed by the advancing linear pressure acts to calender or form a photosensitive interlayer and the photomask is temporarily adhered to the photosensitive interlayer to give a registered sandwich structure in which a photosensitive layer separates a substrate surface and photomask. With application of photosensitive liquid on each of the two surfaces of the substrate, this lamination of calendering process step is preferably carried out by passing a hinged photomask-registered sheet assembly through a pair of pressure rollers. The nip pressure is adjusted according to the viscosity of the liquid, the rate of passage of the substrate through the nip, and the layer thickness desired. In this mode of operation, pressure is first applied at or near the leading edge of the substrate and the flexible photomasks and the trailing portions of each photomask wrap partially around the curved surface of each pressure roll. Photosensitive liquid, preferably photohardenable, is then coated on the surface of the photomask or the substrate or both. In certain cases the photosensitive liquid is applied to the photomask while a lower viscosity liquid is applied to the substrate. Preferably, the registration apparatus is oriented so that the general direction is upward, i.e., the substrate movement relative to the pressure rolls and liquid applicators is in upward direction. It is understood that the substrate, pressure rolls or both can move, or one of the above can be in a stationary position. When so oriented, a conditioning or cleaning action of the liquid on the substrate can be achieved since excess liquid can be used and will simply drain into a catching basin carrying any extraneous matter with it. In addition, the area above the pressure rolls, where actinic exposure preferably occurs, can more easily be kept free of unwanted liquid. This process of obtaining alignment of a coated substrate and photomask is obtained without assistance of reduced pressure. It is understood that only one side of the substrate need be coated and a photomask and pressure means need be present only on one side of the substrate.

It is understood that in the present specification "substantially no movement" means that the surface of the substrate and the photomask do not move relative to one another in directions parallel to their surfaces, i.e., the surfaces do not slide relative to one another to change the alignment of the photomask to the substrate. However, it is understood that "substantially no movement" allows relative movement of the photomask and the substrate layer in the direction perpendicular to their surfaces, to form a more intimate contact, e.g., as excess liquid is squeezed from the interface between the substrate and the photomask to form photosensitive layer. However, the substrate layer and photomask, contacted to the formed photosensitive layer by the advancing pressure line, remain in a fixed relationship in directions parallel and perpendicular to their surfaces.

Also it is understood in the present specification that "contacting" through the photosensitive liquid layer a substrate and a photomask does not exclude intermediate layers. For example the substrate could be wetted by a nonphotosensitive liquid prior to application of the photosensitive liquid. "Contacting" does, however, preclude use of any gas or vapor intermediate layer, e.g., air, which would be considered a gap or out of contact situation.

If the substrate surface is smooth, e.g., with an aluminum plate, a uniform thickness of photosensitive liquid and thereafter bonded hardened material from the photosensitive liquid can be obtained. If the surface of the substrate is not smooth, e.g., having a raised relief pattern such as a printed circuit board, the photosensitive liquid layer will not be uniform due to the raised relief portions. Except for the areas of the substrate containing raised relief portions, the photosensitive liquid layer is a uniform thickness. Also the bonded portions resulting from the photosensitive liquid can likewise be uniform in the same manner.

Once the photomask has been fixed in register over the substrate coated with the photosensitive liquid interlayer, exposure occurs with any source of radiation actinic to the photosensitive liquid for a prescribed period of time. In a preferred mode of operation, the laminated element emerges from the pressure rollers, is stopped and suspended in a fixed upright position and then exposed through a photomask to uniform actinic radiation in the 3000 to 4000 Å or above region. When both sides of the substrate have photosensitive liquid layers, both sides preferably are exposed simultaneously. In an alternative mode of operation, the photosensitive liquid interlayer is irradiated with actinic radiation as it emerges from the pressure rolls and is carried past the irradiation region. In this mode, the irradiation may be focused to a band or a transversely scanned spot of intense actinic radiation may be used whose intensity is adjusted to match the exposure characteristics of the photosensitive layer and the rate of transport. It is also possible to completely remove the substrate from the registration device and expose it on any suitable exposure unit. The photomasks and carrier remain fixed in registration with the substrate and its photosensitive layer by the action of interfacial or viscous forces induced by the interface liquid. It is understood that both interfacial and viscous forces may be present.

Actinic exposure may induce photoadhesion of the liquid to the photomask depending on the materials from which the photomask is made. To insure easy release of the exposed and hardened liquid, the mask surface can be protected or modified with a thin release layer essentially transparent to actinic radiation. The release layer should have strong adhesion to the mask image surface but have weaker adhesion to the hardened photosensitive liquid. The thickness of the release layer should be minimized, e.g., preferably the thickness of the mask image e.g., about 0.001 inch or less, to insure high resolution of the exposed image. One useful release layer is 0.0005 inch polyethylene terephthalate film adhered to the mask image with an adhesive. Others include various waxes and conventional mold release agents. Desirable features of the photomask include sufficient flexibility to be amenable to the coating/lamination process, dimensional stability in prolonged contact with liquid compositions, chemical stability to liquid compositions ready releasability photopolymer compatibility with release coatings from exposed photopolymer and mechanical durability to stress.

When imaging exposure is complete, removal of the photomask or photomasks takes place, e.g., by peeling from the surface of the exposed photosensitive layer thus releasing the imaged element from registration. The imaged element is then transferred from the coating-registration-exposure apparatus and the photomask-carrier assembly can be returned to its initial position to receive the next substrate if a series of substrates is to be imaged. In a preferred mode of operation, for a series of substrates, the pre-exposure process steps, for the most part, are reversed after the exposure step. Thus the exposed laminated element passes back through the pressure means such as rollers and each photomask is pulled back over its respective pressure roller into a storage area until the hinged area on the carrier is reached. At or near this point the photomask-carrier assembly stops and the imaged substrate is ejected to a device which conveys the substrate from the coating-registration-exposure apparatus. Other means than rollers may be used to apply pressure, e.g., a squeegee. Also the pressure means may be movable and the apparatus holding the registered substrate with the photomask may be stationary. In such modes of operation the apparatus would be substantially ready to accept the next sheet in the series to be exposed. In the preferred operation after exposure, the motion of the imaged substrate is in a downward direction and the pressure rollers are separated to allow the imaged substrate to drop to the conveying means. The photomasks can be stored in any number of ways as they are peeled from the imaged sheet. The preferred mode of storage is on a take-up drum on which the photomask surface remains free of extraneous contact. Alternatively, the photomasks can be stored suspended, or can be wound around the pressure roller itself.

The sheet substrate during the registration and imagewise exposure process may be in any orientation including horizontal or vertical. Preferably the substrate will be in a vertical or substantially vertical plane. In the process of this invention any means can be used to convey the substrate to and from the registration position in the apparatus. For the preferred mode of operation in an upward-downward direction, the substrate can be conveyed horizontally on its edge by a belt until positioned under the carrier at which point it is elevated into registration contact by a lifting device. After exposure, the imaged sheet is dropped to the conveyor belt which conveys it horizontally on edge out of the apparatus.

The photosensitive liquid which is applied to the photomask or the substrate element or both, may be either negative working or positive working. Negative working liquids would be photohardenable compositions in which the effect of actinic radiation either directly or indirectly hardens or otherwise alters the rheology of exposed image areas. Preferably insolubilization also occurs. Typical photohardening reactions include free-radical chain addition polymerization, crosslinking reactions and dimerization reactions of prepolymers or the like. Such photohardenable compositions are generally disclosed in "Light Sensitive System" by Kosar, John Wiley & Sons, (1965). Positive working liquids would typically be compositions in which the effect of actinic light is to desensitize or inhibit hardening or other rheological change in exposed image areas. Generally, photodesensitization is followed with a hardening process step which hardens unexposed areas. Such a positive working system is described in U.S. Pat. No. 4,162,162 and 4,269,933.

The photosensitive liquid should possess a viscosity in the unexposed state suitable to form and maintain a continuous layer of uniform thickness between the substrate and the photomask when acted upon by lamination pressure and/or gravitational forces. The optimum liquid viscosity will be influenced by the thickness of the liquid layer, pressure applied in formation of the liquid interlayer between the substrate and photomask, rate of formation of the liquid interlayer, temperature and the orientation of the substrate, e.g., vertical vs. horizontal. The lower viscosity limit is set by that viscosity which provides an acceptably thick and stable photosensitive liquid interlayer between the photomask and substrate under the chosen conditions of lamination pressure, lamination roll durometer (or contact area), and lamination speed, and application requirements. The upper limit is set by the ability of the equipment to deliver a smooth, uniform coating of adequate thickness to the photomask under the same lamination conditions, as well as the ability of the liquid to conform to the circuitry or raised relief if present without massive entrapment of air or bulk low viscosity liquid.

Preferred negative working photosensitive liquids are photopolymerizable liquids containing at least one monomer which preferably is an addition polymerizable ethylenically unsaturated compounds having one or more terminal ethylenic groups and a free radical generating addition polymerization initiator system activatable by actinic radiation. Generally, the liquids also contain polymeric binders, filler materials and other monomers either alone or in combination to adjust viscosity and other properties of the photosensitive liquid. The liquids may also contain other components such as dyes, pigments, plasticizers, adhesion aids, thermal inhibitors, etc. which may be required for specific uses of the coated article. Examples of useful monomers, initiators, binders and other components are listed below.

Monomers: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethylacrylate, 1,4-cyclohexanediol diacrylate, 2,2-dimethylol propane diacrylate, glycerol diacrylate, tripropylene glycol diacrylate, glycerol triacrylate, trimethylolpropane triacrylate, pentaerythritol triacrylate, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di(p-hydroxyphenyl)-propane dimethacrylate, di-(3-methacryloxy-2-hydroxypropyl) ether of Bisphenol-A, di-(2-methacryloxyethyl)ether of Bisphenol-A, di-(3-acryloxy-2-hydroxypropyl)ether of Bisphenol-A, di-(2-acryloxyethyl)ether of Bisphenol-A, di-(3-methacryloxy-2-hydroxypropyl)ether of tetrachloro-Bisphenol-A, di-(2-methacryloxyethyl)ether of tetrachloro-Bisphenol-A, di-(3-methacryloxy-2-hydroxypropyl)ether of tetrabromo-Bisphenol-A, di-(2-methacryloxyethyl)ether of tetrabromo-Bisphenol-A, di-(3-methacryloxy-2-hydroxypropyl)ether of 1,4-butanediol, di-(3-methacryloxy-2-hydroxypropyl)ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the photohardenable layer can also contain at least one of the following free-radical initiated, chain-propagating, addition polymerizable, ethylenically unsaturated compounds having a molecular weight of at least 300. These monomers include, preferably, an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, which is incorporated by reference, e.g., those having a plurality of addition polymerizable ethylenic linkages, particularly when present as terminal linkages, and especially those wherein at least one and preferably most of such linkages are conjugated with a double bonded carbon, including carbon doubly bonded to carbon and to such hetero atoms as nitrogen, oxygen and sulfur. Outstanding are such materials wherein the ethylenically unsaturated groups, especially the vinylidene groups, are conjugated with ester or amide structures.

Initiators: substituted or unsubstituted polynuclear quinones which are compounds having two intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloroanaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in Plambeck U.S. Pat. No. 2,760,863 and include vincinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc; α-hydrocarbon substituted aromatic acyloins, including α-methylbenzoin, α-allylbenzoin and α-phenylbenzoin. In addition the photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes may be used. Other suitable polymerization initiators are Michler's ketone, benzophenone 2,4,5-triphenylimidazolyl dimers with hydrogen doners, and mixtures thereof as described in U.S. Pat. Nos. 3,427,161; 3,479,185 and 3,549,367. Similarly, the cyclohexadienone compounds of U.S. Ser. No. 271,241, filed June 8, 1981, Pat. No. 4,341,860, are useful as initiators.

All the aforementioned U.S. patents and applications are incorporated by reference.

Binders: Binders can be used individually or in combination or in combination with filler material to adjust viscosity of the photosensitive liquid. Typical binders include: polyacrylate and α-alkyl polyacrylate esters, e.g., polymethyl methacrylate and polyethylmethacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrenes; vinylidene chloride copolymers, e.g., vinylidene chloride/acrylonitrile, vinylidene chloride/methacrylate and vinylidene chloride/vinyl acetate copolymers; polyvinyl chloride and copolymers, e.g., polyvinyl chloride/acetate; high molecular weight polyethylene oxides of polyglycols having average molecular weights of 4000 to 1,000,000; epoxides; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; synthetic rubbers, e.g., butadiene/acrylonitrile, acrylonitrile/butadiene (carboxy-modified, e.g., 3%) acrylonitrile/butadiene/styrene, alkyl (1 to 4 carbon atoms) methacrylate/acrylonitrile/butadiene, alkyl (1 to 4 carbon atoms) methacrylate/styrene/acrylonitrile/butadiene interpolymers, 2-chlorobutadiene/1,3-polymers, chlorinated rubber, styrene/butadiene/styrene, styrene/isoprene/styrene block copolymers and other block copolymers described by Holden et al. in U.S. Pat. No. 3,265,765 which is incorporated by reference, n-butyl methacrylate, polyether polyurethane resin, etc., nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose, polycarbonates; polyvinyl acetal, e.g., polyvinyl butyral, polyvinyl formal; polyformaldehydes.

Fillers: If desired the photopolymerizable layers can also contain immiscible polymeric or nonpolymeric organic or inorganic fillers or reinforcing agents which are essentially transparent at wavelengths used for exposure of the photopolymeric material, e.g., the organofilic silicas, bentonites, silica, powdered glass, colloidal carbon as well as various types of dyes and pigments in amounts varying with the desired properties of the photopolymerizable layers. Particulate thickness disclosed in U.S. Pat. Nos. 3,754,920 and 3,785,817 are useful for this purpose.

Other optional additives include: inhibitors, dyes, pigments, plasticizers, etc.

Suitable thermal polymerization inhibitors include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitroso dimers, e.g., 1,4,4,-tri-methyl-2,3-diazobicyclo-[3.2.2]-non-2-ene-2,3-dioxide, dinitrobenzene, p-toluquinone and chloranil.

Various dyes may be added to increase the visibility of the image formed. Pigments may also be used in this capacity. Any colorant used, however, should preferably be transparent to the actinic radiation used.

Useful plasticizers may be any of the common plasticizers which are compatible with any polymeric binder used, e.g., dialkyl phthalate, polyethylene glycol, and alkyl phosphates.

Although the photosensitive liquid may be applied to either the photomask or substrate, the liquid may be applied to both the photomask and substrate. Alternatively, a different photosensitive liquid can be concurrently applied to each surface to produce a resulting layer with a gradient of characteristics. In addition, it is not necessary that the different liquids both be photosensitive, two nonphotosensitive liquids or one photosensitive and one nonphotosensitive liquid applied concurrently can combine to form a single photosensitive layer between the substrate and photomask. Furthermore, different systems can be applied to the front and back surfaces of the substrate.

In still another embodiment of the invention where the photosensitive liquid is applied to the photomask, the substrate can be treated to a conditioning liquid. Such conditioning liquids may be cleaning or etching solutions which remove dirt or unwanted surface oxides or the like. Such cleaning liquids may be used in conjunction with mechanical cleaning as disclosed in U.S. patent application Ser. No. 153,636 filed May 27, 1980 refiled as Ser. No. 341,618, U.S. Pat. No. 4,405,394. The conditioning liquids may be subbing solutions or solutions of adhesion promotors such as disclosed in U.S. Pat. No. 3,645,772. In instances where the photosensitive layer is to be applied to a substrate with a relief surface, e.g., a soldermask to a circuit board, a conditioning liquid such as a monomer, plasticizer or liquid such as disclosed in U.S. Pat. No. 4,069,076 may be applied to the substrate to eliminate bubble or air entrapment at the relief surface during lamination. Alternatively, when the photosensitive liquid is applied to the substrate surface, a nonphotosensitive liquid can be applied to the photomask surface to condition or clean the surface, e.g., application of release agent to prevent photoadhesion to the photomask during imaging exposure.

Any means may be used to apply, the liquid to the substrate surfaces. The primary requirements for the application means are that they do not damage the surfaces and they do not induce cross-contamination of liquids being applied.

In the Figures are shown the process of the present invention carried out on both sides of a substrate in a vertical orientation. The substrate such as a circuit board may be held in any orientation including horizontal and only one side or surface can be treated.

Figure 1:
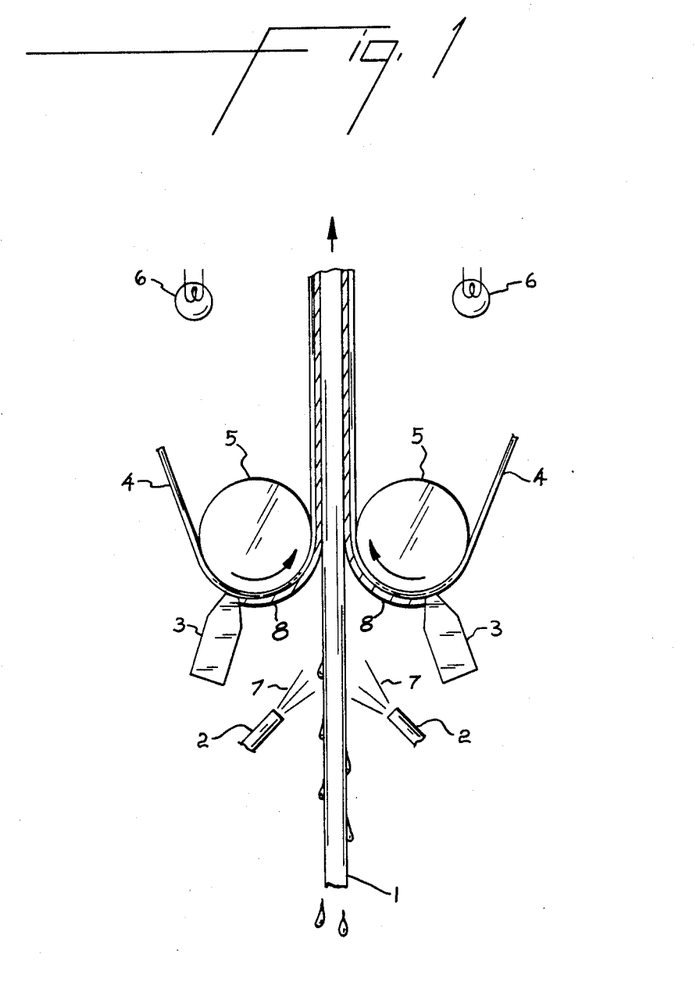
FIG. 1 is a schematic representation of a preferred process of the present invention.

FIG. 1 shows a sheet substrate (1) carried in an upward direction. Spray nozzles (2) apply a fluid (7) e.g., low viscosity liquid, to the substrate with excess liquid allowed to drain by gravity. Coating dies (3) apply a photosensitive liquids of higher viscosity than the fluid directly to photomasks (4). The photomasks unwind around rolls (5) to contact the substrate through the photosensitive liquid (8) as the substrate moves in an upward direction. Sources (6) of actinic radiation exposes portions of the photosensitive liquid through the photomasks (4). After exposure the process is reversed with the substrate (1) passing in a downward direction and the photomasks rewinding around rolls (5).

Figure 2:
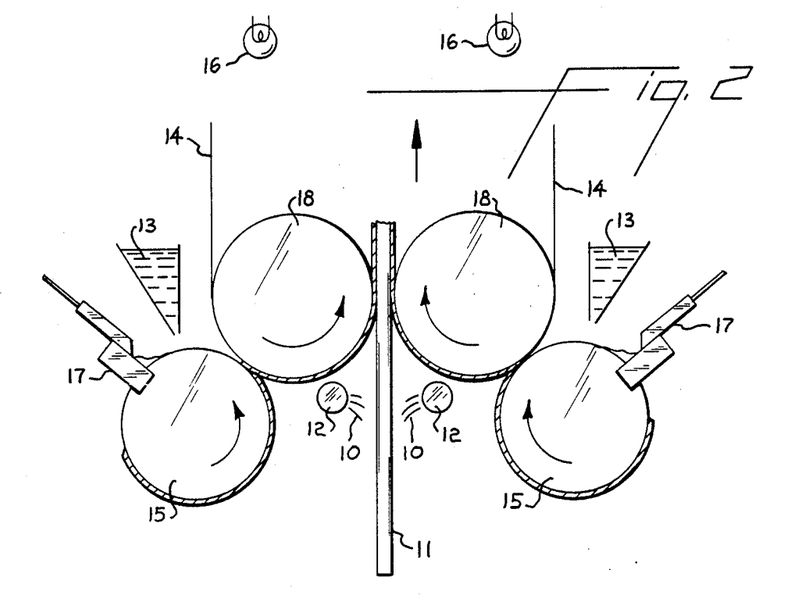
FIG. 2 is a further schematic representation demonstrating an alternate coating technique.

FIG. 2 shows an alternate manner of applying the photosensitive liquid to the substrate. (Alignment of the photomask and substrate is not shown.) The substrate (11) is moved in an upward direction and coated with a fluid from nozzles (12). A higher viscosity photosensitive liquid is applied from gravity feeders (13) to rolls (15). A doctor knife (17) controls the thickness of the photosensitive liquid on the roll. The photomasks (14) are wound around (18) transferring photosensitive liquid from roll (15). The upward direction of the substrate and the direction of travel of the photomask traps a uniform thickness of photosensitive material between the substrate and photomask. After exposure from actinic sources (16), the process is reversed except that coating roll (15) is retracted without further liquid fed or application of fluid from nozzles (12).

In an alternate mode, e.g., of the FIG. 2 embodiment nozzles (12) or a different set of nozzles are used to apply developer to bonded hardened material resulting from the photosensitive layer after exposure. In such case the developer can be applied while the substrate is moving in a downward direction.

Figure 3:
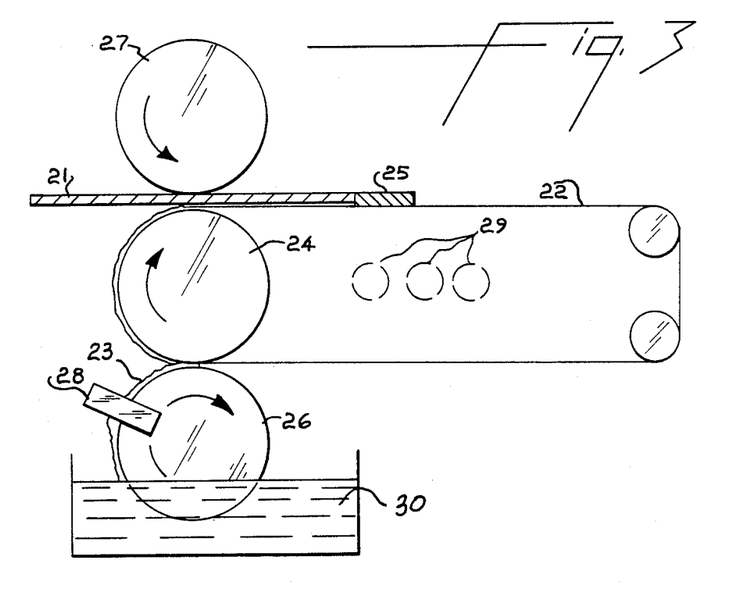
FIG. 3 is another schematic representation of an alternate coating technique.

FIG. 3 shows a horizontal manner of applying the photosensitive liquid to one side of a substrate. The photomask (22) in the form of a continuous web is wound around roll (24). The substrate (21) is registered to the photomask by a carrier bar (25) fixed to the photomask web (22). Photosensitive liquid (30) present as a layer of photosensitive liquid (23) is transferred from an applicator roll (26) to the photomask and is applied to the surface of the substrate (21) as it passes horizontally between pressure roll (27) and the photomask at roll (24). The thickness of the applied layer is controlled by a doctor knife (28) on the applicator roll (26). Sources (29) of actinic radiation exposes portions of the photosensitive liquid through the photomask (22). After exposure the process is reversed with the substrate (21) passing in the reverse horizontal direction and the photomask (22) rewinds around roll (24).

The process of this invention is particularly useful in sensitizing and imaging a sequence of similar sheet substrates. Such a repetitive process includes preparation of printed circuit boards from copper clad substrates (known as primary imaging) as well as the application of a permanent masking layer (known as solder mask) to the printed circuit boards prior to soldering. In some particular instances the repetitive process of this invention can be combined with standard dry film resist processes such as that disclosed in U.S. Pat. No. 3,469,982 to produce improved resist images, e.g., such as a "tenting" resist. Thus a sequence of copper clad substrates laminated with a dry film photoresist having superior adhesion properties can be treated by the process of this invention with a photosensitive liquid which would impart superior processing characteristics to the imaged combined resist layer.

The process of this invention is also useful in the graphic arts industry for preparing lithographic printing plates and letterpress printing plates with improved surface characteristics. By coating an aluminum plate with a neat photopolymerizable liquid and imaging using the process of this invention, a lithographic plate can be produced with less labor and time which is more uniform and would have greater wear resistance than litho plates conventionally prepared with liquid. By the process of this invention neat photopolymerizable liquids can be applied to photopolymerizable deep relief printing plates, particularly flexographic plates of the type described in U.S. Pat. No. 4,323,636 to modify printing surface features and/or to correct surface defects produced during manufacture, storage or handling.

For the examples, viscous photopolymerizable liquids are prepared having the following compositions by combining the ingredients in a container and stirring with an air-motor driven, propeller-type stirrer until a homogeneous solution is obtained (between 4 and 24 hours, depending on temperature and rate of agitation). Unless otherwise specified, component amounts are given in parts by weight and viscosities are given in poise as determined using a Brookfield viscometer measured at 25° C. at 6 rpm with spindle No. 5.

| Viscous Photopolymerizable Liquids | | | |
|---|---|---|---|
| Component | A | B | C |
| Tripropylene glycol diacrylate | 64 | 43 | 62.1 |
| Trimethylol propane triacrylate | — | 21 | — |
| Terpolymer of 56% ethylacrylate, 37% methyl methacrylate, and 7% acrylic acid: mol. wt. ca. 260,000, acid no. ca. 76–85, and TG 37° C. | 27.1 | 27.1 | 26.3 |
| Carboset ® 515 acrylic resin - 100% Viscosity 2,000,000 CP, acid No. 63, mol. wt. 7,000, and TG 14° C. | 6.5 | 6.5 | 6.3 |
| Tert-butyl anthraquinone | 2 | 2 | 1.9 |
| Diethyl hydroxyl amine | 0.2 | 0.2 | 0.2 |
| 2-Mercapto-1,3,4 triazole | 0.2 | 0.2 | 0.2 |
| HVT Green Pigment | — | — | 3 |
| Liquid viscosity | 857 | 824 | 857 |

Low viscosity fluids are prepared by combining the ingredients listed in the following table:

| Low Viscosity Fluid | | | | | |
|---|---|---|---|---|---|
| Component | AA | BB | CC | DD | EE |
| Tripropylene glycol diacrylate | 100 | 98 | 97.6 | 92.6 | 69.4 |
| Tert-butyl anthraquinone | — | 2 | 2 | 2 | 1.5 |
| Diethyl hydroxylamine | — | — | 0.2 | 0.2 | 0.15 |
| 2-Mercapto-1,3,4-triazole | — | — | 0.2 | 0.2 | 0.15 |
| Terpolymer of 56% ethyl acrylate, 37% methyl methacrylate, and 7% acrylic acid: mol. wt. ca. 260,000; acid no. ca. 76–85; and TG 37° C. | — | — | — | 5 | 3.8 |
| Ethoxy ethoxy ethyl acrylate | — | — | — | — | 25 |

EXAMPLE 1

A single side of a printed circuit board is registered, coated with a viscous photopolymerizable liquid at room temperature and imagewise exposed using reverse-roll coating of the viscous liquid "A" in an apparatus depicted in FIG. 3.

The photomask is prepared from a conventional diazo material. The image surface of the photomask is protected by adhering a sheet of Tapcor Emulsion Protection film (Tapcor Inc., Rochester, N.Y.) which is a 0.0005 inch clear polyester film with a 0.0005 inch adhesive layer. Attached in register to the photomask web is a circuit board guide (25) containing registration tabs thereon and having the approximate thickness of the printed circuit board to be imaged.

A printed circuit board (21) having about 0.003 inch high circuit pattern on one side of a 0.062 inch thick fiberglass epoxy board have on a leading edge registration notches which conform to registration tabs of the circuit board guide (25). The printed circuit board is dipped into low viscosity liquid "AA" and the liquid is spread over the printed circuit pattern with a brush.

The protected surface of the photomask is coated with a layer of viscous liquid A by the following procedure. Applicator roll rotating in a clockwise direction picks up liquid (23) from a feeding pan (30). A metering knife (28) located above the applicator roll surface controls the coating thickness and coating width and with two scrappers at both ends prevents depositing excess liquid banks on the photomask. As the photomask (22) wraps around roll (24) in a clockwise direction the photomask's protected surface skims the coated surface of the rotating applicator roll (24) to transfer the coated liquid to the protected surface.

As the circuit board guide (25) passes through the nip formed by pressure roll (27) and the photomask wrapped around roll (24) the notches of the coated printed circuit board (21) are fitted onto the registration tabs of the guide (25) so that the printed circuit board is drawn through the nip in register with the image of the photomask. As the board passes through the nip, the coated circuit surface contacts the viscous liquid layer and a uniformly coated printed circuit board results by squeezing any excess liquid from the nip. The desired thickness of 0.004 inch of resulting coating is obtained by adjusting the metering knife, the speed at which the coating takes place, and/or the pressure applied by roll (27). When the trailing edge of the printed circuit board passes through the nip, the motion is stopped and with the composite element held in place the coated layer is imagewise exposed through the adhered photomask to actinic radiation from a bank of UV fluorescent lamps four inches from the plane of the photomask.

After actinic radiation exposure is complete, pressure roll (27) is raised and the motion of the photomask web is reversed to eject the imaged circuit board. The photohardened image separates completely from the protective surface of the photomask and remains firmly adhered to the circuit board surface. Any unhardened viscous liquid remaining with the photomask surface is recombined with fresh liquid during processing of subsequent boards to be imaged.

When the resulting imaged board is inspected no air entrapped bubbles can be detected along circuit lines even by microscopic examination (30X) which can detect bubbles of less than 0.0003 in. Bubble free protective coating is an important criteria for protective masks used during soldering, i.e., as solder masks. When a similar printed circuit board is coated only with viscous liquid "A", i.e., no precoating with low viscosity liquid "AA", and imaged, air entrapment in the form of bubbles are observed along circuit lines perpendicular to the path of coating.

Unhardened liquid remaining on the imaged circuit board is removed in a commercially available ADS-24 processor using 1% $NaCO_3$ aqueous solution at 95° F. at a processor speed of 3-4 feet/minute to produce a printed circuit board having a hardened protective coating over the entire circuit pattern except for pad areas corresponding to through-holes in which electrical components are to be soldered.

After development the protective coatings are cured by baking the boards for 1 hour in an oven at 300° F. followed by two passes through a commerically available U.V. Cure Apparatus at 10 feet/minute. The circuit board is then ready for conventional finishing, fluxing, inserting electrical components and soldering.

EXAMPLE 2

Solder mask coatings are prepared substantially as described in Example 1 but with alternate low viscosity liquids and viscous photopolymerizable liquids.

When viscous liquid C containing a light absorbing pigment is used with low viscosity liquid AA, resolution of developed image is improved.

A series of imaged and cured circuit boards are prepared using each of the viscous photopolymerizable solutions, A, B & C with each of the precoating low viscosity liquids AA, BB, CC, DD, and EE and each of the cured boards are subjected to the following end-use testing:

Each board is treated with aqueous or rosin flux and then passed over a typical wave of solder at 260° C. at a speed of 5 feet/min. The hardened area above circuit lines are examined for "breakdown", i.e., puckering, flaking off or blistering. All boards precoated with either liquid CC, DD or EE survived with no breakdown.

Each board is subjected to a hot air leveling test which is simulated by first dipping in a pot of solder at 274° C. for 5 seconds, then dipping the board into aqueous or rosin flux for 2 sec and then returning the board to the pot of solder for 5 additional seconds. Breakdown as described above occurs for all samples after emerging from the flux. When new samples are prepared by adjusting the coating thickness to 0.006 inch and tested, no breakdown occurs.

Each board, which is treated with aqueous or rosin flux and then passed over a wave solder described above, is tested for defluxing. When aqueous flux is used, the board is placed for 5 minutes in an aqueous 5% trisodium phosphate solution at 140° F. The images on all boards are not attacked by the treatment. When rosin flux is used, the board is dipped for 3 min in boiling $CH_3CCl_3$, then for 3 min in $CH_3CCl_3$ at room temperature and then into the vapors of boiling $CH_3CCl_3$ for 3 min. Boards prepared from liquid B are untouched, and boards prepared from liquids A and C are slightly attacked at image edges.

EXAMPLE 3

Solder mask coatings are prepared substantially as described in Example 1 but with an improved low viscosity liquid FF. Low viscosity liquid FF is prepared with the following components:

| Component | Parts by Weight |
| --- | --- |
| Tripropylene glycol diacrylate | 42 |
| t-Butyl anthraquinone | 2 |
| Epon ® 828 (a liquid epoxy resin of Shell Chemical Co. having an Epoxide equivalent 185-192, a viscosity (Gardner & Holdt) of 100-160 per weight per gal of about 9.7 lbs and a refractive index at 20° C. of 1.573 | 52 |
| Dicyandiamide | 4 |
| 5-Mercaptotriazole | 0.2 |

The above components are mixed with mechanical stirring and then milled with ¼ inch ceramic rods for 24 hours to disperse the sparingly soluble dicyandiamide into the liquid.

Using viscous photopolymerizable liquid A and the above low viscosity liquid FF, single sided printed circuit boards are coated with a 0.004 inch layer of photopolymerizable liquid, imaged and developed as described in Example 1. As in Example 1 no entrapped bubbles are observed.

Samples of developed boards are cured by the following procedures and then subjected to testing procedures of Example 2.

Cure Method (1) Bake for 1 hour at 150° C.
(2) Bake for 1 hour at 150° C. then pass once through the UV cure apparatus described in Example 1.
(3) Bake 30 min at 150° C., then 30 min at 165° C.
(4) Bake 15 min at 150° C., then 15 min at 165° C.
(5) Bake 15 min at 150° C., then 5 min at 165° C.
(6) Irradiate for 20 sec with high intensity infrared radiation.

Boards cured by methods 2, 3, 4 and 6 survive the wave solder test, simulated hot air leveling test and the aqueous and solvent defluxing tests without breakdown as described in Example 2. Boards cured by methods 1 and 5 survive all tests except the solvent defluxing test.

Boards cured by methods 2, 3, and 6 are further subjected to a thermal shock test by cycling the boards between −65° C. and 150° C. for 100 times. For boards cured by methods 2 and 3 there is no visible affect due to the thermal shock test. For the board cured by method 6, cracking of the mask appears after 20 cycles.

EXAMPLE 4

A series of similar printed circuit boards are prepared by registering each copper clad subtrate and simultaneously coating and imaging both sides of the substrate using reverse roll coating of the viscous liquid "C" in an apparatus depicted in FIG. 2.

The photomasks to be used for imaging both sides of each substrate are prepared as in Example 1 with a protective surface and are attached in register to a pin bar registration mechanism.

Each copper clad substrate consists of a rectangular fiberglass board, copper clad on both sides and having a pattern of copper plated through-holes in register with two registration holes at one edge of the substrate. Prior to coating, both copper surfaces of each substrate are chemically cleaned and optionally may be sprayed with a surface treating liquid (10) as the substrate is being raised for coating.

The protected surface of both photomasks are simultaneously coated with a 0.001 inch layer of viscous liquid "C" by the reverse roll coating procedure substantially as described in Example 1 except that viscous liquid C is gravity fed to the applicator roll from a hopper (13). To provide complete coverage with photopolymer of the area to be imaged, registration holes of the substrate and registration attachment of the photomasks, are sufficiently displaced from the image area so that the complete image area of the photomsk is coated before passing between the pressure rolls (18).

For each coating and imaging cycle the following procedure is followed. Initially pressure rolls (18) are displaced outward so as to open the nip between the protected surfaces of the photomasks and to lift each protected photomask surface from the applicator rolls (15) and the pin bar registration mechanism is displaced in a position above the open nip. The cleaned copper clad substrate is positioned edgewise on a substrate lifting device (not shown) with the uppermost edge containing registration hole aligned with the registration bar. The substrate is raised until it engages the pin bar mechanism which pin registers and grips the substrate. The registered substrate and bar are moved downward just to the open nip and the nip is closed by moving pressure rolls (18) inward to engage the applicator rolls and the bar-substrate mechanism. The registered substrate and coated photomasks are then raised through the nip and the coated composite element is suspended in place between two banks of exposure sources.

Sufficient pressure is applied by rolls (18) to produce a uniform coating thickness of 0.001 inch. Both sides of the composite element are irradiated for 10 seconds to the U.V. lamps. Pressure rolls (18) are then displaced to their initial positions and the pin bar mechanism and photomasks return to their initial positions at which point the pin bar mechanism releases the imaged substrate and the substrate is lowered by the lifting device. The imaged substrate is removed for further processing and is replaced by the next substrate to be imaged and the cycle is repeated. During the downward transition after imaging exposure both photomasks are peeled from the imaged photohardened surfaces. Although some unhardened photopolymer adheres to the protective surface of the photomasks all hardened image areas remained firmly adhered to copper substrate surfaces.

As the imaged substrates are removed from the coating and exposure unit, they are developed in an ADS-24 processor using 1% $NaCO_3$ aqueous solution at 95° F. at a processor speed of 3 feet/minute to remove any unhardened photopolymerizable liquid remaining on the imaged copper clad substrate. After development the photoresist-protected substrates are processed using conventional plate and etch procedures to produce identical two sided printed circuit boards.

In some instances a liquid containing adhesion promotors such as disclosed in U.S. Pat. No. 3,645,772 are sprayed onto the cleaned copper clad surfaces of the substrate as it is raised past the nozzles (12) to improve final resist adhesion during processing. Similarly adhesion may be improved to the copper surface by spraying with a low viscous solution "CC".

In other instances, rather than coating the photomasks with photopolymerizable liquid, the cleaned copper clad surfaces are coated as the substrate is raised past a coating or spraying station to the pin bar mechanism. With such a variation, extended photomasks or substrates would not be required and very thin coatings would be possible.

In still other instances, a substrate surface cleaning station is put in line with the coating and imaging unit. In this instance, copper clad substrates are fed through the station into the nip of the coating and imaging unit thereby insuring uniformity in the copper surfaces to be coated and producing more consistent quality in the resulting printed circuit boards.

EXAMPLE 5

An elastomeric composite relief structure is prepared as follows. A photosensitive element is prepared as described in Example 8 of U.S. Ser. No. 237,861 filed Feb. 25, 1981 abandoned, consists of a 0.005 inch polyester support, an adhesive layer, a 0.080 inch thick layer of a photopolymerizable elastomer, a polyamide layer and a cover sheet. After the cover sheet and polyamide layer are removed the element is exposed through the polyester support for two minutes to actinic radiation from a bank of fluorescent lamps. The lamps are placed on two inch centers, spaced 2½ inches from the sheet. This exposure forms a uniform insoluble "floor" in the photopolymer layer. The substrate (21) is then attached to the guide (25) in the device shown in FIG. 3 and described in Example 1; the photopolymer side of the sheet is arranged to face the photomask (22).

A photopolymerizable syrup (23) called "Merigraph Resin FA 140-3", and Marketed by Hercules is placed in the coater pan (30).

The photomask (22) is a conventional silver halide litho film bearing high-contrast line and/or halftone images. The photomask (22) is coated with a 0.0045 inch thick layer of syrup by the application roll (26) and metering knife (28), and the substrates is registered to the photomask by notches (21) and guide tabs (25) as described in Example 1. After the trailing edge of the substrate passes through the nip, motion is stopped and the syrup and underlying photopolymerizable elastomer are imagewise exposed through the photomask to actinic radiation from lamp bank (29) for 10 minutes. After exposure, the substrate is ejected as in Example 1; a relief image is immediately evident in the hardened syrup. The unhardened syrup together with the unexposed areas of the photopolymerizable elastomer are removed in a Cyrel ® Aqueous Processor in which the element is brushed for 10 minutes with a solution of 0.5% NaOH and 15.5% butyl carbitol in water at 140° F. The developed element is then dried in an oven at 60° C. for 15 minutes.

The element produced is an image in about 0.025 inch relief on a photopolymerized elastomeric "floor" and a polyester support. Total thickness is 0.0895 inches-0.0850 inches of the original structure plus 0.0045 inches of imagewise polymerized syrup securely bonded to the surface of the elastomer relief.

EXAMPLE 6

A lithographic printing plate is prepared as in Example 5 except as noted below. The substrate is 0.012 in thick anodized aluminum; clearly no exposure through the substrate was needed or possible. The syrup is spread in a layer 0.0005 to 0.0010 inches thick and comprises Composition A. The photomask is a conventional silver halide litho film bearing high contrast line and halftone images. It is protected with Tapcor Emulsion Protection Film as described in Example 1. Imagewise exposure is 12 seconds.

After ejection, the unpolymerized syrup is washed away in a ADS-24 processor running at five feet/minute. Washout solution is aqueous 0.5% $Na_2CO_3$ at 85° F. The result is a plate having hardened line and halftone photopolymerized images on the anodized aluminum substrate.

The plate is next treated with an asphaltum gum such as "AGE" by Western Litho. The surplus is removed with a swab and the plate allowed to dry. To print, the plate is wet with water or other "fountain solution" and then inked with lithographer's ink as is well known. The ink is retained on the photopolymerized image areas but does not coat the wet anodized aluminum. This inked image can then be transferred to paper directly or through an intermediate offset blanket as is well known in the lithographer's art.

What is claimed is:

1. A process of imagewise exposure to actinic radiation of a photosensitive layer applied to a sheet substrate with registration of a photomask to the substrate comprising the steps of:
    (1) advancing a planar sheet substrate to a position in a device to undertake in either order or concurrently
        (a) aligning the substrate and a flexible photomask in a predetermined hinged relationship to one another;
        (b) applying a photosensitive liquid between the substrate and the photomask with said liquid applied in excess compared to the amount necessary to form a layer in step (2);
    (2) contacting through the photosensitive liquid the substrate maintained in a planar configuration and the photomask by advancing line pressure whereby during said contacting substantially no movement of the photomask occurs relative to the substrate other than a more intimate contact due to displacement of the photosensitive liquid in a liquid layer whereby excess liquid is squeezed from an interface between the substrate and the photomask to form a photosensitive layer and whereby at least one of interfacial or viscous force aids in holding the substrate and photomask in a fixed position relative to one another without a gap present formed by a gas or vapor intermediate layer;
    (3) exposing the photosensitive liquid to actinic radiation through the photomask;
    (4) removing the photomask from the substrate whereby substantially no hardened material resulting from the photosensitive liquid remains on the photomask;
    (5) obtaining a substrate containing discrete portions of bonded hardened material resulting from the photosensitive liquid.

2. The process of claim 1 wherein the substrate surface is substantially smooth.

3. The process of claim 1 wherein the substrate surface contains raised portions and the surface of the photosensitive liquid layer facing the photomask is substantially smooth prior to exposure of the photosensitive liquid to actinic radiation.

4. The process of claim 1 whereby photosensitive liquid between the substrate and the photomask is displaced and the substrate and photomask are brought into more intimate contact by an advancing nip.

5. The process of claim 1 wherein the application of photosensitive liquid is to a substrate surface held in a substantially vertical plane.

6. The process of claim 1 wherein the application of photosensitive liquid is to a substrate surface held in a substantially horizontal plane.

7. The process of claim 1 wherein the photosensitive liquid is applied to a photomask surface which faces the substrate.

8. The process of claim 1 wherein the photosensitive liquid is applied to substrate surface which faces the photomask.

9. The process of claim 1 wherein photosensitive liquid is applied to both sides of the sheet substrate which is exposed to actinic radiation.

10. The process of claim 1 wherein the photosensitive liquid layer is negative working.

11. The process of claim 1 wherein the photosensitive liquid layer is positive working.

12. The process of claim 1 wherein the photosensitive liquid contains a photohardenable component.

13. The process of claim 1 wherein the photosensitive liquid contains a photohardenable addition polymerizable component.

14. The process of claim 1 wherein the substrate contains a photosensitive layer prior to and on the same side as application of the photosensitive liquid.

15. The process of claim 14 wherein the photosensitive layer and photosensitive liquid are exposed simultaneously to actinic radiation.

16. The process of claim 1 wherein a number of substrates are employed to obtain substantially identical imaged substrates.

17. The process of claim 1 wherein prior to application of the photosensitive liquid a lower viscosity fluid is first applied to the substrate.

18. The process of claim 1 wherein developer is applied to bonded hardened material immediately after step 5.

19. The process of claim 18 wherein the developer is applied while the substrate is in a substantially vertical plane and during or immediately after removal of a photomask from the substrate.

20. The process of claim 1 wherein a pressure foller is employed to apply the advancing line pressure.

21. A process of application and imagewise exposure to actinic radiation of photosensitive layers on a sheet substrate on opposite sides of a sheet substrate, comprising the steps of:
    (1) advancing a planar sheet substrate in an upright position to undertake in either order or concurrently
        (a) aligning the substrate with a photomask comprising two flexible sheet portions wherein each of the sheet portions faces an opposite surface of the substrate with the substrate and photomask in a predetermined hinged relationship to one another;

(b) applying photosensitive liquid between each substrate surface and flexible sheet portions of the photomask with said liquid applied in excess compared to the amount necessary to form each layer in step (2);

(2) contacting through the photosensitive liquid the substrate maintained in a planar configuration and the photomask by advancing lin pressure whereby during said contacting substantially no movement of the photomask occurs relative to the substrate other than a more intimate contact due to displacement of photosensitive liquid in two liquid layers whereby excess liquid is squeezed from an interface between the substrate and each flexible sheet portion to form two photosensitive layers and whereby at least one of interfacial or viscous force aids in holding the substrate and photomask in a fixed relationship without a gap present formed by a gas or vapor intermediate layer;

(3) either sequentially or simultaneously exposing through the sheet portions of the photomasks each of the two photosensitive liquid layers to actinic radiation;

(4) removing sequentially or simultaneously each of the sheet portions of the photomask after exposure of the two liquid interfaces to actinic radiation;

(5) removing the substrate containing discrete portions of bonded hardened material obtained from the photosensitive liquid whereby substantially no hardened material resulting from the photosensitive liquid remains on the photomask, whereby steps 1 to 5 can be repeated.

22. The process of claim 21 whereby steps 1 to 5 are repeated for similar sheet substrates to obtain substantially identical imaged substrates.

23. The process of claim 21 wherein a pressure roller is employed to apply the advancing line pressure.

24. A process of imagewise exposure to actinic radiation of a photosensitive layer on a planar sheet substrate with registration of a photomask to the substrate comprising the steps of
  (1) forming a first photosensitive liquid layer between the planar substrate and a flexible photomask with liquid present in excess compared to the amount necessary to form a second layer in step (2);
  (2) registering the photomask to the substrate maintained in a planar configuration in a hinged relationship to one another whereby substantially no movement of the photomask occurs on the photosensitive liquid layer relative to the substrate other than a more intimate contact due to displacement of liquid between the photomask and substrate whereby excess liquid is squeezed by advancing line pressure from an interface between the substrate and photomask to form a second photosensitive layer and whereby at least one of interfacial or viscous force aids in holding the substrate and photomask relative to one another without a gap present formed by a gas or vapor intermediate layer;
  (3) exposing the photosensitive liquid to actinic radiation through the photomask;
  (4) removing the photomask from the substrate;
  (5) obtaining a substrate containing discrete portions of bonded hardened material obtained from the photosensitive liquid.

25. The process of claim 24 wherein a pressure roller is employed to apply the photosensitive layer between the substrates and photomask.

* * * * *